(12) United States Patent
Burani et al.

(10) Patent No.: US 10,863,623 B2
(45) Date of Patent: Dec. 8, 2020

(54) CIRCUIT CONFIGURATION FOR CONTROLLING A POWER SEMICONDUCTOR DEVICE WITH TWO CIRCUIT CARRIERS AND A PLASTIC MOLDED BODY AND ARRANGEMENT HAVING SAID CONFIGURATION

(71) Applicant: SEMIKRON ELEKTRONIK GMBH & CO. KG, Nuremberg (DE)

(72) Inventors: Nicola Burani, Nuremberg (DE);
Roland Bittner, Stegaurach (DE);
Matthias Kujath, Nuremberg (DE);
Peter Mauer, Fürth (DE)

(73) Assignee: SEMIKRON ELEKTRONIK GmbH & CO. KG, Nuremberg (DE)

( * ) Notice: Subject to any disclaimer, the term of this patent is extended or adjusted under 35 U.S.C. 154(b) by 0 days.

(21) Appl. No.: 16/365,948

(22) Filed: Mar. 27, 2019

(65) Prior Publication Data
US 2019/0335584 A1 Oct. 31, 2019

(30) Foreign Application Priority Data
Apr. 27, 2018 (DE) .......................... 10 2018 110 222

(51) Int. Cl.
H05K 1/14 (2006.01)
H05K 1/18 (2006.01)
H05K 7/14 (2006.01)

(52) U.S. Cl.
CPC .............. *H05K 1/144* (2013.01); *H05K 1/18* (2013.01); *H05K 7/1427* (2013.01);
(Continued)

(58) Field of Classification Search
CPC ........ H05K 1/144; H05K 7/1427; H05K 1/18; H05K 2201/10121; H05K 2201/1003; H05K 2201/042; H05K 1/145
See application file for complete search history.

(56) References Cited

U.S. PATENT DOCUMENTS

| 10,178,787 B2 * | 1/2019 | Francis ................. H01F 27/306 |
| 2015/0221432 A1 * | 8/2015 | Zhou ....................... H01F 27/40 |
| | | 361/679.01 |

(Continued)

*Primary Examiner* — Rockshana D Chowdhury
(74) *Attorney, Agent, or Firm* — Andrew F. Young, Esq.; Nolte Lackenbach Siegel

(57) ABSTRACT

A circuit configuration for controlling a power semiconductor device has a first circuit carrier and a second circuit carrier arranged parallel to and spaced apart from the first, and having a plastic molded body arranged in an intermediate space between the first and second circuit carrier, wherein the first circuit carrier has a first conductor track with a first contact point, which can be implemented in particular as a contact pad or as a contact receptacle, which is arranged on a main side of the first circuit carrier facing the plastic molded body, wherein the second circuit carrier has a second conductor track with a second contact point, which is arranged on a main side of the second circuit carrier facing the plastic molded body, wherein the plastic molded body has a first holder for a first component with a first and a second contact device, and wherein the first contact device is electrically conductively connected to the first contact point and the second contact device is electrically conductively connected to the second contact point.

6 Claims, 3 Drawing Sheets

(52) U.S. Cl.
 CPC ............... *H05K 2201/042* (2013.01); *H05K 2201/1003* (2013.01); *H05K 2201/10121* (2013.01)

(56) References Cited

U.S. PATENT DOCUMENTS

| | | | |
|---|---|---|---|
| 2015/0305188 A1* | 10/2015 | Maeda | H02M 7/003 361/728 |
| 2018/0308612 A1* | 10/2018 | Park | H01F 5/04 |
| 2019/0214184 A1* | 7/2019 | Mo | H01F 27/266 |
| 2019/0326213 A1* | 10/2019 | Kamgaing | H01L 28/10 |

* cited by examiner

CIRCUIT CONFIGURATION FOR CONTROLLING A POWER SEMICONDUCTOR DEVICE WITH TWO CIRCUIT CARRIERS AND A PLASTIC MOLDED BODY AND ARRANGEMENT HAVING SAID CONFIGURATION

CROSS REFERENCE TO RELATED APPLICATIONS

This application relates to, and claims priority from, DE Ser. No.: 10 2018 110 222.4 filed on Apr. 27, 2018, the entire contents of which are incorporated herein by reference.

FIGURE SELECTED FOR PUBLICATION

FIG. 4.

BACKGROUND OF THE INVENTION

Field of the Invention

The invention describes a circuit configuration for controlling a power semiconductor device having a first circuit carrier and a second circuit carrier. The invention also describes an arrangement having such a circuit configuration.

Description of the Related Art

It is known from the general prior art to connect two circuit carriers, in particular two printed circuit boards arranged parallel to each other, in an electrically conductive manner by means of plug-and-socket connectors.

ASPECTS AND SUMMARY OF THE INVENTION

Having regard to the prior art, the object of the invention is to present a circuit configuration and an arrangement therewith, wherein different components can be arranged spatially and in terms of circuit technology in a particularly advantageous way.

This object is achieved according to the invention by a circuit configuration having the features of the claims, and by an arrangement having the features of the claims, as well as alternative and adaptive features understood from study of the enclosed disclosure.

In the circuit configuration according to the invention for controlling a power semiconductor device having a first circuit carrier and a second circuit carrier arranged parallel to and spaced apart from the first, and having a plastic molded body arranged in an intermediate space between the first and second circuit carrier, the first circuit carrier has a first conductor track with a first contact point, which can be implemented in particular as a contact pad or as a contact receptacle, which is arranged on a main side of the first circuit carrier facing the plastic molded body, and the second circuit carrier has a second conductor track with a second contact point, which is arranged on a main side of the second circuit carrier facing the plastic molded body, wherein the plastic molded body has a first holder for a first component with a first and a second contact device, and wherein the first contact device is electrically conductively connected to the first contact point and the second contact device is electrically conductively connected to the second contact point.

This connection can be preferably implemented by means of plug connectors, press-fit contacts or spring contacts.

The first holder with the first component located therein is preferably filled by means of an electrically insulating casting compound. It is usually sufficient if the component is completely covered, in other words the holder is not necessarily filled up to its rim. The casting compound can also be designed to dissipate the heat generated in the component as efficiently as possible.

It can often be preferable if the first component has at least one other first and one other second contact device, the first circuit carrier has at least one other first contact point, the second circuit carrier at least one other second contact point and the other first contact device and the other second contact device are electrically conductively connected in a circuit-compatible manner to the other first contact point and the other second contact point respectively.

Such first components can be preferably implemented as an electrically isolating transmission component, in particular as a transformer or as an optocoupler.

In particular, it is practical and preferable if additional components having additional contact devices are arranged in additional holders of the plastic molded body and if said additional components are electrically conductively connected to associated additional contact points on at least one of the circuit carriers. Examples of such additional components are printed circuit boards or current sensors, or an assembly consisting of both of these.

It is particularly advantageous if first support surfaces of the plastic molded body rest on the first circuit carrier. It is equally advantageous if second support surfaces of the plastic molded body rest on the second circuit carrier. If both embodiments are realized at the same time this results in an assembly consisting of the first and second circuit carrier and the plastic molded body, which enables a particularly simple further use of this assembly.

In a particularly preferred embodiment of the circuit configuration, the plastic molded body is designed and provided to form an electrical insulation, in particular conforming to the requirements of EN 60664 (current version), between the first and second circuit carrier. The first circuit carrier can be the primary side and the second circuit carrier the secondary side of a driver for a power semiconductor device, which has a particularly compact design because the insulation is not formed on one circuit carrier but is distributed over two circuit carriers.

The arrangement according to the invention is designed with a circuit configuration as described above and with a power semiconductor device, wherein the second circuit carrier is electrically conductively connected to the power semiconductor device by means of control connections. It can be advantageous to design load connections in essentially the same manner, as long as the current-carrying capacity of the associated circuit carrier is adequately dimensioned.

It is particularly advantageous if the power semiconductor device is designed as a power semiconductor module or as a power semiconductor sub-module. In this case the power semiconductor device can have a separate housing or sub-housing. An advantageous alternative to this is a common housing of the circuit arrangement and the power semiconductor device.

Of course, provided this is not explicitly or inherently excluded or does not contradict the idea of the invention, each of the features or groups of features referred to in the singular, for example the respective contact points and contact devices, can be present more than once in the circuit arrangement or the arrangement according to the invention.

It goes without saying that the various embodiments of the invention, regardless of whether they are used in connection with the circuit configuration or with the arrangement, can be implemented either individually or in any combination in order to achieve improvements. In particular, the above features and those mentioned below can be applied not only in the specified combinations, but also in other combinations or in isolation, without departing from the scope of the present invention.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
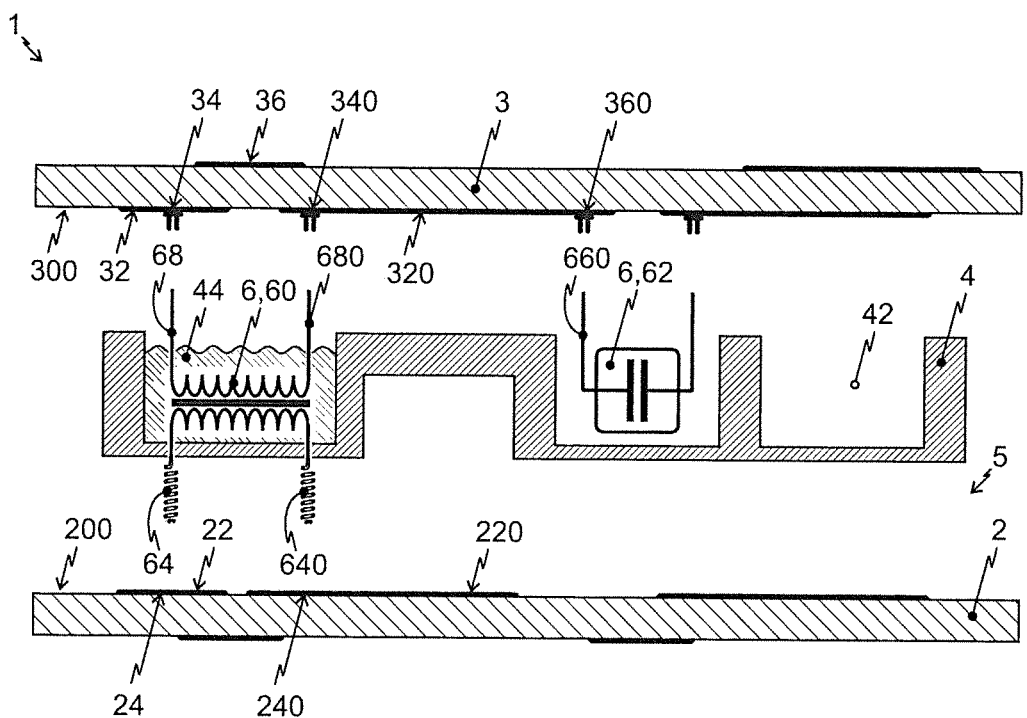
FIG. 1 shows a schematic representation of a first embodiment according to the invention of a circuit configuration in a lateral cross-sectional view.

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'link' or 'connect' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

In the present text, numerous specific details are set forth in order to provide a thorough understanding of exemplary versions of the present invention. It will be apparent, however, to one skilled in the art, that some versions of the present invention may possibly be practiced without some of these specific details. Indeed, reference in this specification to "a variant," "variants," preference, and "one/the variant," or "one version" and the like, should be understood to mean that a particular feature, structure, or characteristic described in connection with the variant or version is included in at least one such variant or version according to the disclosure. Thus, the appearances of phrases such as "in one variant," "in one version," and the like, in various places in the specification are not necessarily all referring to the same version or variant, nor are separate or alternative versions or variants mutually exclusive of other versions or variants. Moreover, various features may be described which possibly may be exhibited by some variants or versions and not by others. Similarly, various requirements are described which may be requirements for some variants or versions, but not others. Furthermore, as used throughout this specification, the terms 'a', 'an', 'at least' do not denote a limitation of quantity, but rather denote the presence of at least one of the referenced item, in the sense that singular reference of an element does not necessarily exclude the plural reference of such elements. Concurrently, the term "a plurality" denotes the presence of more than one referenced items. Finally, the terms "connected" or "coupled" and related terms are used in an operational sense and are not necessarily limited to a direct connection or coupling.

Various operations may be described as multiple discrete operations in turn, in a manner that may be helpful in understanding embodiments of the present invention; however, the order of description should not be construed to imply that these operations are order dependent.

FIG. 1 shows a schematic representation of a first embodiment according to the invention of a circuit configuration 1 in an exploded view and lateral cross-sectional view. The drawing shows a first circuit carrier 2, implemented here as an industry-standard printed circuit board with conductor tracks 22, 220 on its first 200 and second main side. This printed circuit board 2 is designed and provided, in particular, to carry the primary-side components of the circuit as part of a power electronics driver circuit.

The drawing also shows a second circuit carrier 3, also implemented here as an industry-standard printed circuit board with conductor tracks on its first 300 and second main side. This printed circuit board 3 is designed and provided, in particular, to carry the secondary-side components of the circuit as part of a power electronics driver circuit.

The two printed circuit boards 2, 3 are here arranged parallel to each other and spaced apart, wherein an intermediate space 5 is formed at least between sections of the two printed circuit boards 2, 3. In other words, at least sections of the printed circuit boards are arranged flush with each other in the normal direction to their main sides 200, 300.

In the intermediate space 5 and possibly also overlapping this, a plastic molded body 4 is arranged, which has a multiplicity of recesses, the openings of which each face one of the printed circuit boards 2, 3. These recesses form receptacles 42, which are designed to allow components 6, in particular electrical or electronic components, to be arranged herein.

In one of the receptacles 42 here, a transmitter 60 is arranged, thus technically a transformer. This transmitter 60 is designed to transmit electrical signals in an electrically isolated manner from the first printed circuit board 2 to the second printed circuit board, and if applicable, back. The term signal should be understood here to mean in particular control or measurement signals. Such a signal can also be an energy signal, however, by means of which power is transferred from the first to the second printed circuit board in order to supply it with energy. All of these types of signals are commonly used in the field in power electronics driver circuits.

The receptacle 42 of the transformer 60, which here is designed without a separate housing, is almost completely filled by an electrically insulating casting compound 44.

This casting compound 44 is used, on the one hand, for the internal electrical insulation of the transformer 60, as well for fixing the transformer 60 in the receptacle 42.

The transformer 60 here has two first contact devices 64, 640, which here, without restriction of generality, are designed as spring contacts. These first contact devices 64, 640 produce an electrically conductive connection to associated first contact points 24, 240 of the first printed circuit board 2. To this end, two conductors 22, 220 of the first printed circuit board 2, here the main side 200 facing the plastic molded body 4, have first contact points 24, 240, here designed as contact surfaces.

The transformer 60 here has two second contact devices 68, 680, which here, without restriction of generality, are designed as part of a plug-and-socket connector, here as plugs. These second contact devices 68, 680 produce an electrically conductive connection to associated second contact points 34, 340 of the second printed circuit board 3. To this end, two conductors 32, 320 of the first printed circuit board 3, here the main side 300 facing the plastic molded body 4, have second contact points 34, 340, here designed as sockets.

In a further receptacle 42 a further component 62 is arranged, in this case a capacitor. This capacitor 62 has additional contact devices 660, which here form a plug-and-socket connection to sockets 360 on other conductor tracks of the second printed circuit board 3.

Figure 2:
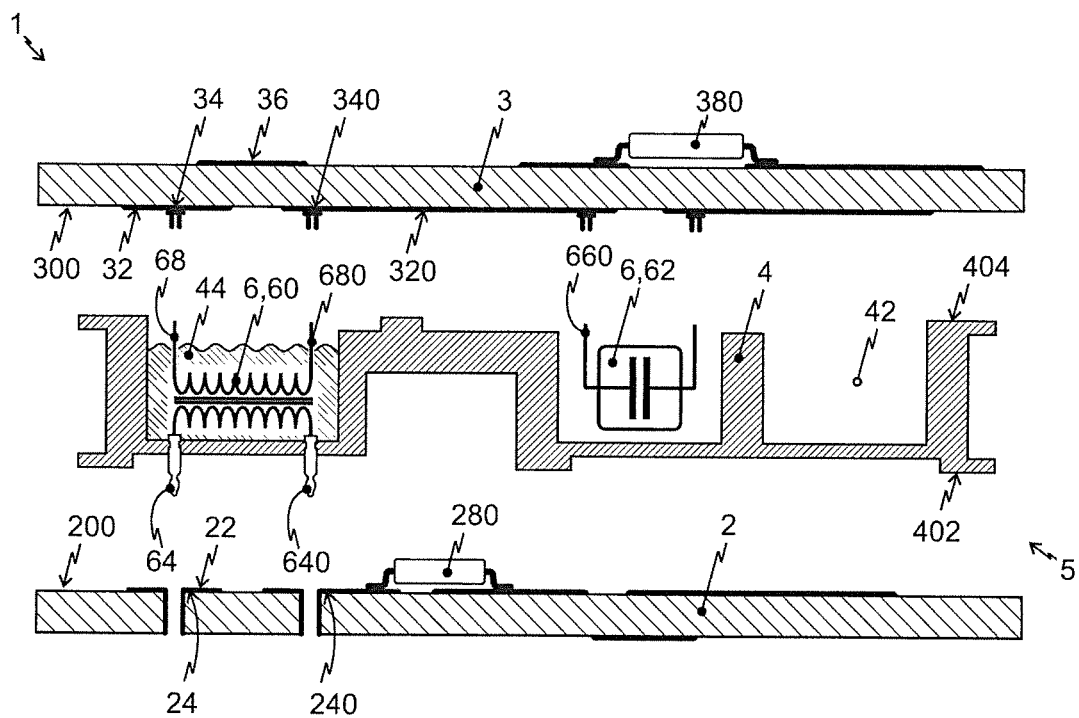
FIG. 2 shows a schematic representation of a second embodiment according to the invention of a circuit configuration in a lateral cross-sectional view.

FIG. 2 shows a schematic drawing of a second embodiment according to the invention of a circuit configuration 1 in an exploded view and lateral cross-sectional view, wherein this embodiment is essentially similar to the first. Differences are described below.

The molded plastic body 4 of this second embodiment, in addition to that of the first embodiment, has a first and second support surface 402, 404, which are designed to rest on associated main sides 200, 300 of the respective printed circuit boards 2, 3, as a result of which the two printed circuit boards 2, 3 and the plastic molded body 4 form a structural unit, which can be installed as a whole in a power electronics arrangement, for example.

Furthermore, the first contact devices 64, 640 are designed here as industry-standard press-fit contacts. The first printed circuit board 2 of this second embodiment has industry-standard recesses as first contact points 24, 240 for receiving these press-fit contacts.

In addition, purely by way of example, an electronic component 280 is shown on the first main side 200 of the first printed circuit board 2. In the assembled state of the printed circuit board 2 and of the plastic molded body 4 this component is located in one of the receptacles.

The second printed circuit board 3, purely by way of example, also has an electronic component 380 on its second main side and is otherwise identical to that of the first embodiment.

Figure 3:
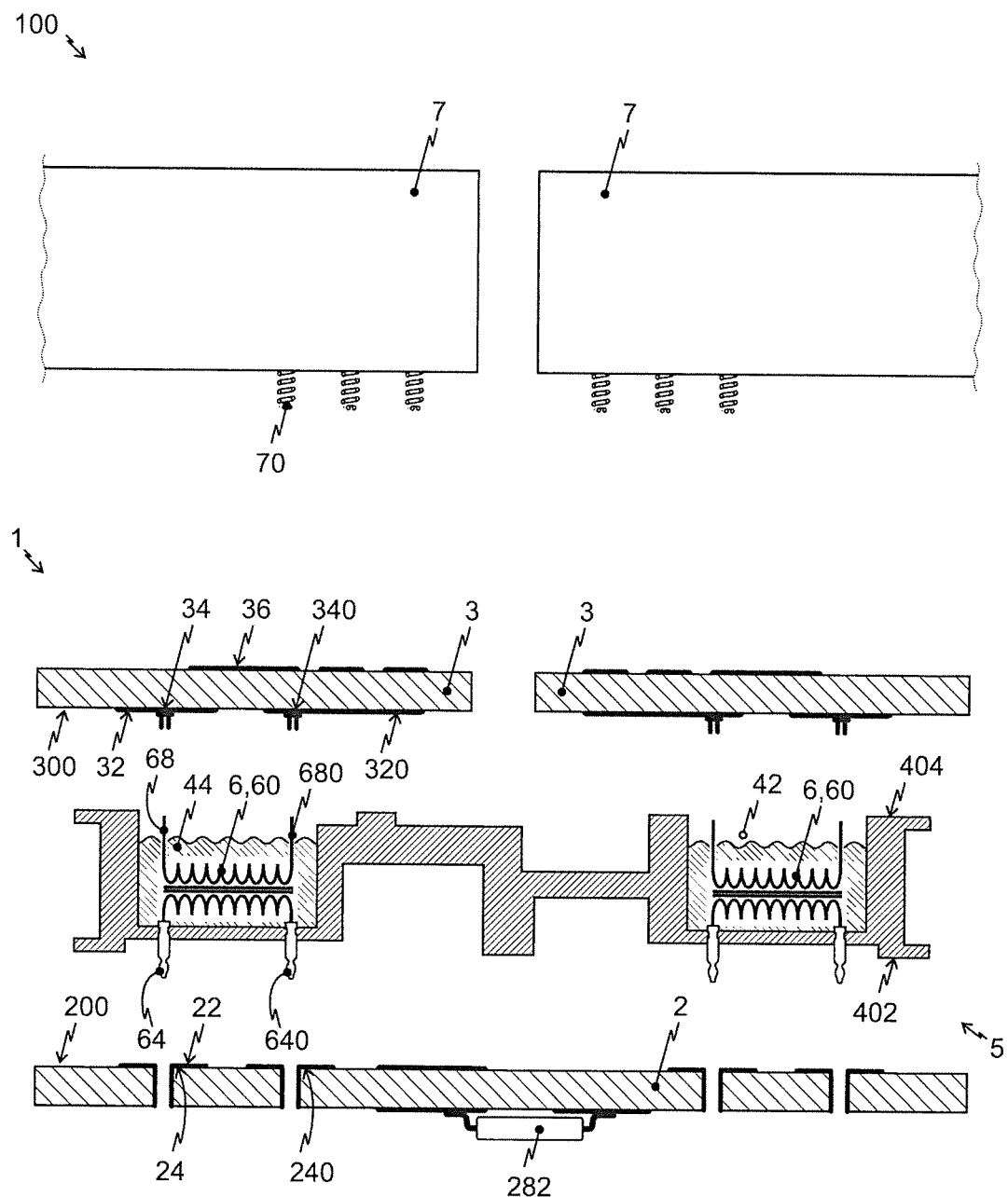
FIG. 3 shows a schematic representation of an arrangement according to the invention with a circuit configuration and two power semiconductor modules in an exploded view and lateral cross-sectional view.

FIG. 3 shows a schematic representation of an arrangement 100 according to the invention with a circuit configuration 1 and two power semiconductor modules 7 in an exploded view and a lateral cross-sectional view. The plastic molded body 4 here has identical transformers 60 in two receptacles 42, which are essentially designed and arranged like that of FIG. 2.

The first printed circuit board 2 has corresponding first contact devices 24, 240 for the press-fit contacts of the two transformers.

The drawing also shows two second circuit carriers 3, here implemented in each case as an industry-standard printed circuit board with conductor tracks 32, 320 on the first and second main side. These second printed circuit boards 3 are designed and provided, in particular, to carry the secondary-side components of the circuit as part of a power electronics driver circuit for the arrangement 100 according to the invention.

To the second printed circuit boards 3, or more precisely to conductor tracks 36 of the second main side, a power semiconductor module 7 is electrically conductively connected in each case, here by means of contact springs 70. These connections are implemented at least as auxiliary terminal connections, in particular for transmitting control signals. It is also standard practice to transmit sensor signals, for example of temperature sensors from the power semiconductor module 7 to the printed circuit board 3. In some applications and with the appropriate power semiconductor modules 7, load connections can also be implemented between the respective second circuit board 3 and the associated power semiconductor module 7.

In addition, purely by way of example an electronic component 282 is shown on the second main side of the first printed circuit board 2.

Figure 4:
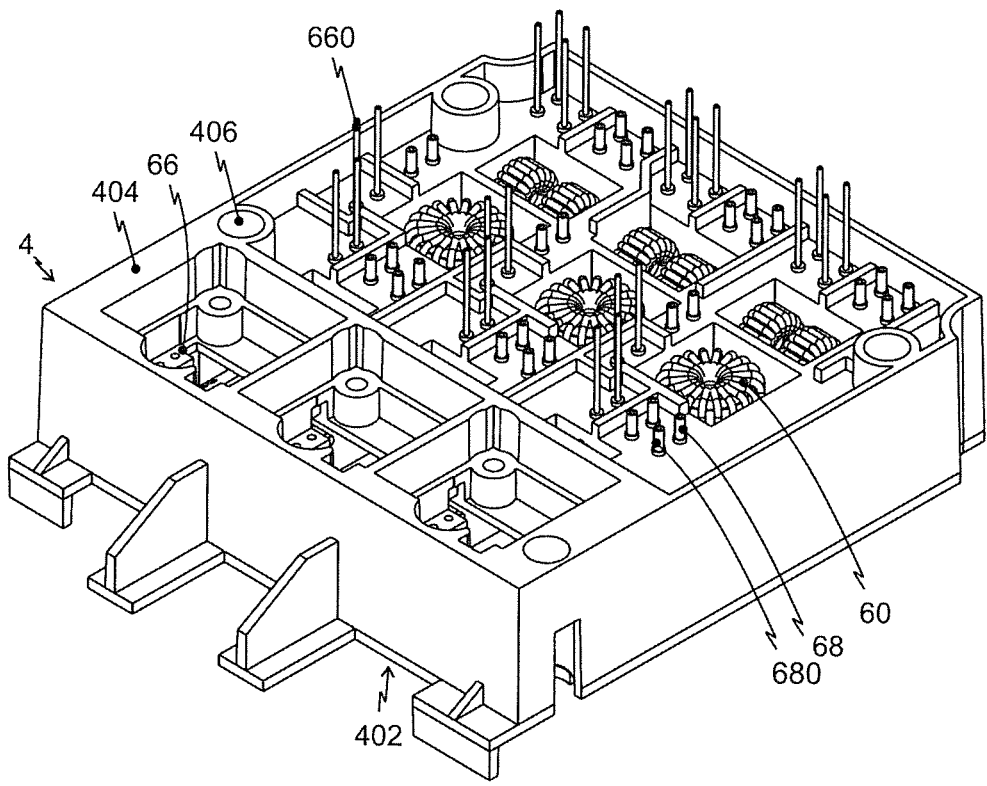
FIGS. 4 and 5 show, in a three-dimensional elevation and plan view, an embodiment of a plastic molded body of a circuit configuration according to the invention.
Figure 5:
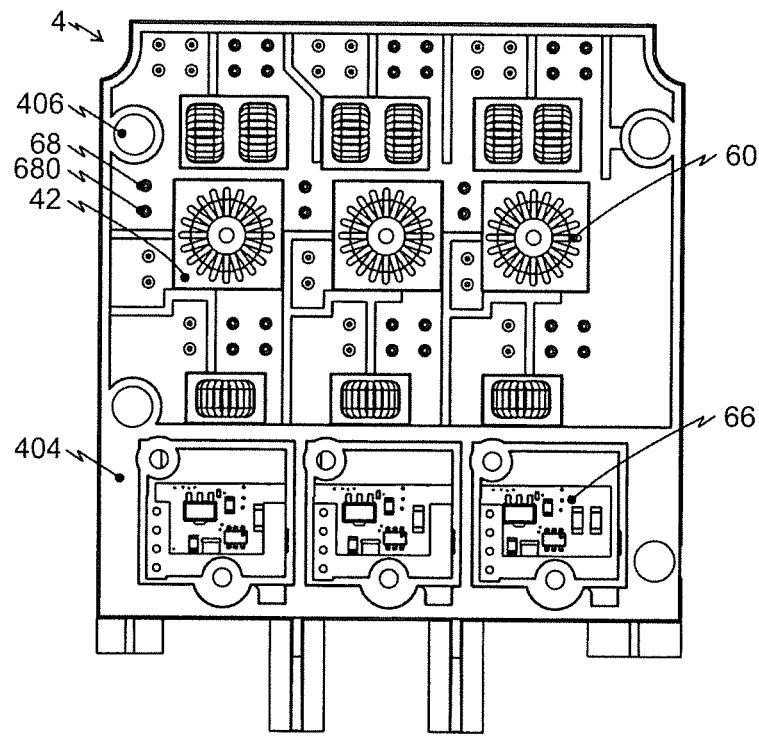

FIGS. 4 and 5 show, in a three-dimensional elevation and in plan view, an embodiment of a plastic molded body 4 of a circuit configuration according to the invention. These plastic molded bodies 4 are used in the context of a power electronics arrangement for connecting the primary-side circuit section of a driver circuit to three secondary-side circuit sections of a three-phase bridge circuit.

To this end the plastic molded body 4 has three transformers 60, here designed for the transmission of energy, in each case arranged in associated receptacles 42. A casting compound has been omitted from the drawing for reasons of clarity. In addition, further components are shown for transmitting control signals, as well as three current measuring devices 66, each having a current sensor and a third printed circuit board for evaluating the signals of the respective current sensor.

Also shown are second contact devices 68, 680, as well as second support surfaces 404 for a second printed circuit board 3, which here carries all secondary-side circuit sections for all three phases. In addition, mounting devices 406 are shown, which together with screws, not shown, are used to form a structural unit out of the plastic molded body 4 and the printed circuit boards, not shown.

It should be noted here that features of different exemplary embodiments of the invention, provided the said features are not mutually exclusive, can of course be freely combined without departing from the scope of the invention.

It is further observed that, naturally, characteristics of the various exemplary embodiments of the invention, provided that said characteristics are not mutually exclusive, can be mutually combined as desired, without departing from the scope of the invention.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A circuit arrangement, for controlling a power semiconductor device, comprising:

a first circuit carrier and a second circuit carrier arranged parallel to and spaced apart from the first and a plastic molded body arranged in an intermediate space between the first and second circuit carrier;

the first circuit carrier has a first conductor track with a first contact point, which is arranged on a main side of the first circuit carrier facing the plastic molded body;

the second circuit carrier has a second conductor track with a second contact point, which is arranged on a main side of the second circuit carrier facing the plastic molded body;

the plastic molded body has a first holder for holding and retaining a first component with a first and a second contact device extending in opposing directions; and the first contact device is electrically conductively connected to the first contact point on the main side of the first circuit carrier and the second contact device is electrically conductively connected to the second contact point on the main side of the second circuit carrier;

the first contact device and the second contact device extend in different directions;

the first holder with the first component located therein, forms a continuously bounded retaining reservoir filled by means of an electrically insulating casting compound;

the first component additionally has at least one other first and one other second contact device extending in opposing directions;

the first circuit carrier has at least one other first contact point on the main side of said first circuit carrier;

the second circuit carrier has at least one other second contact point arranged on said main side of said second circuit carrier;

the at least one other first contact device and the at least one other second contact device are electrically conductively connected in a circuit-compatible manner to the at least one other first contact point and the at least one other second contact point respectively; and the plastic molded body rests on at least two first contact surfaces upon the main side of the first circuit carrier and includes at least two opposite side second contact surfaces contacting on the main side of the second circuit carrier.

2. The circuit arrangement, according to claim 1, wherein:
the first component is designed as an electrically isolating transmission component, in particular as a transformer or as an optocoupler.

3. The circuit arrangement, according to claim 1, wherein:
a plurality of additional components having respective additional contact devices are arranged in additional holders of the plastic molded body and said additional components are electrically conductively connected to associated additional contact points on at least one of the circuit carriers.

4. The circuit arrangement, according to claim 1, wherein:
the plastic molded body is designed and provided to form an electrical insulation between the first and second circuit carrier.

5. An arrangement, having a circuit arrangement according to claim 1, further comprising:
a power semiconductor device; and
wherein the second circuit carrier is electrically conductively connected to the power semiconductor device by means of control connections.

6. The arrangement according to claim 5, wherein:
the power semiconductor device, is a power semiconductor module or a power semiconductor sub-module.

* * * * *